(12) United States Patent
Bartley et al.

(10) Patent No.: US 8,299,608 B2
(45) Date of Patent: Oct. 30, 2012

(54) ENHANCED THERMAL MANAGEMENT OF 3-D STACKED DIE PACKAGING

(75) Inventors: Gerald K. Bartley, Rochester, MN (US); David R. Motschman, Rochester, MN (US); Kamal K. Sikka, Hopewell Junction, NY (US); Jamil A. Wakil, Austin, TX (US); Xiaojin Wei, Hopewell Junction, NY (US); Jiantao Zheng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 12/832,732

(22) Filed: Jul. 8, 2010

(65) Prior Publication Data

US 2012/0007229 A1 Jan. 12, 2012

(51) Int. Cl.
*H01L 23/36* (2006.01)
*H01L 21/58* (2006.01)

(52) U.S. Cl. ........ 257/712; 257/713; 257/717; 257/724; 257/E21.499; 257/E21.505; 257/E23.101; 257/E23.102; 361/702; 361/709; 438/109; 438/118; 438/122

(58) Field of Classification Search .................. 257/712, 257/713, 717, 724, E21.499, E21.505, E23.101, 257/E23.102; 361/702, 709; 438/109, 118, 438/122
See application file for complete search history.

(56) References Cited

U.S. PATENT DOCUMENTS

| | | | |
|---|---|---|---|
| 4,364,620 A | 12/1982 | Mulholland et al. | |
| 5,276,289 A * | 1/1994 | Satoh et al. | 174/260 |
| 6,239,366 B1 | 5/2001 | Hsuan et al. | |
| 6,442,033 B1 | 8/2002 | Liu et al. | |
| 6,472,741 B1 | 10/2002 | Chen et al. | |
| 7,518,225 B2 | 4/2009 | Emma et al. | |
| 7,592,697 B2 | 9/2009 | Arana et al. | |
| 7,928,562 B2 * | 4/2011 | Arvelo et al. | 257/712 |
| 2006/0268519 A1 * | 11/2006 | Bartley et al. | 361/699 |
| 2008/0001283 A1 | 1/2008 | Lee et al. | |
| 2008/0042261 A1 | 2/2008 | Wolter et al. | |
| 2009/0236718 A1 | 9/2009 | Yang et al. | |
| 2009/0321959 A1 | 12/2009 | Hedler et al. | |
| 2010/0019377 A1 | 1/2010 | Arvelo et al. | |
| 2010/0044856 A1 * | 2/2010 | Sri-Jayantha et al. | 257/717 |
| 2011/0205708 A1 * | 8/2011 | Andry et al. | 361/702 |

OTHER PUBLICATIONS

Gerlach, David W., et al., "Parametric Thermal Modeling of 3D Stacked Chip Electronics with Interleaved Solid Heat Spreaders", ITHERM, 2006, pp. 1208-1212.
International Search Report/Written Opiinion, Feb. 28, 2012.

* cited by examiner

*Primary Examiner* — Dao H Nguyen
(74) *Attorney, Agent, or Firm* — Cantor Colburn LLP; Joseph Petrokaitis

(57) ABSTRACT

A die stack package is provided and includes a substrate, a stack of computing components, at least one thermal plate, which is thermally communicative with the stack and a lid supported on the substrate to surround the stack and the at least one thermal plate to thereby define a first heat transfer path extending from one of the computing components to the lid via the at least one thermal plate and a fin coupled to a surface of the lid and the at least one thermal plate, and a second heat transfer path extending from the one of the computing components to the lid surface without passing through the at least one thermal plate.

23 Claims, 7 Drawing Sheets

ENHANCED THERMAL MANAGEMENT OF 3-D STACKED DIE PACKAGING

BACKGROUND

Aspects of the present invention are directed to enhanced thermal management of 3-D stacked die packaging.

DESCRIPTION OF THE BACKGROUND

Generally, an electronic package is a hardware component in which active devices, such as logic or memory devices, and passive devices, such as resistors and capacitors, are enclosed. The electronic package performs functions of an electronic system, such as those used inside a mobile phone, a personal computer, a digital music player, etc. Common electronic packages are classified as either flip-chip or wire-bond packages.

In a typical flip-chip electronic package, as shown in FIG. 1, a single die 10 is joined to a ceramic or organic material substrate 100 through controlled collapse chip connection (C4) bumps 130, which may be encapsulated in an underfill material 160. A lid 120 provides thermal cooling and mechanical protection for the die 10. A thermal interface material (TIM) 150, which can be an elastomer, adhesive, gel or metal, may be disposed between the chip 10 and the lid 120. A bond 170, such as an elastomer, epoxy or mechanical fasteners, attaches the lid 120 to the substrate 100. The substrate 100 may be further coupled to a printed circuit board (PCB) 110 via leads 140.

In order to increase bandwidth and function, the package shown in FIG. 1 is enhanced, as shown in FIG. 2, with multiple dies 11, 12, 13 and 14 being attached to a multi-chip substrate 101. Here, the electronic package grows in dimension to accommodate the multiple dies 11, 12, 13 and 14 and presents cost, size-related and reliability trade-offs. In yet another configuration, which is shown in FIG. 3, multiple dies 15-18 are vertically stacked onto a single-chip substrate 102.

Since a set of chips, resistors, capacitors and/or memory units may be provided in a particular die stack, it may be a complete functional unit requiring few external components. As such, use of the die stack in space-constrained environments, such as mobile phones and computers, may be valuable. Also, a stacked die can provide an increased electrical interconnect density with less latency and lower power consumption, which can increase system performance. This is especially true with "multicore" chips where it is sometimes difficult to increase the bandwidth to memory adequately.

Despite its benefits, however, a problem with a vertically configured die stack exists in that the upper die provides thermal resistance along the primary heat flow path from the die stack and into the cooling lid (e.g., the lid 120 of FIG. 1). During normal operations, this thermal resistance causes an internal temperature of an electronic chip within a die stack to increase as compared to that of a non-stacked electronic die. As a result, performance of the electronic package with a die stack may be degraded.

A solution to this problem has been proposed in U.S. patent application Ser. No. 12/177,194 entitled "SEGMENTATION OF A DIE STACK FOR 3D PACKAGING THERMAL MANAGEMENT," the entire contents of which are incorporated herein by reference. In that case, the lid, acting as a heat spreader, is disposed in a heat transfer relationship with a surface of a chip at a bottom of a vertical stack with the top chip(s) generally being smaller than the bottom chip or otherwise being segmented into smaller blocks.

SUMMARY

In accordance with an aspect of the invention, a die stack package is provided and includes a substrate, a stack of computing components, at least one thermal plate, which is thermally communicative with the stack and a lid supported on the substrate to surround the stack and the at least one thermal plate to thereby define a first heat transfer path extending from one of the computing components to the lid via the at least one thermal plate and a fin coupled to a surface of the lid and the at least one thermal plate, and a second heat transfer path extending from the one of the computing components to the lid surface without passing through the at least one thermal plate.

In accordance with another aspect of the invention, a method of assembling a die stack package is provided and includes forming a stack of computing components, positioning at least one thermal plate in thermal communication with the stack and surrounding the stack and the at least one thermal plate with a lid supported on a substrate to thereby define a first heat transfer path extending from one of the computing components to the lid via the at least one thermal plate and a fin coupled to a surface of the lid and the at least one thermal plate, and a second heat transfer path extending from the one of the computing components to the lid surface without passing through the at least one thermal plate.

In accordance with another aspect of the invention, a die stack package is provided and includes a substrate on which underfill is disposed with electrical connections embedded therein, a thermal plate disposed on the underfill, a stack of alternating layers of adhesive and computing components disposed on the thermal plate and in electrical communication with the electrical connections, a thermal interface material (TIM) disposed on respective surfaces of the stack and the thermal plate and a lid adhered to the substrate to surround the thermal plate and the stack, the lid including a lid surface, which thermally communicates with the stack surface TIM, and a fin, which thermally communicates with thermal plate surface TIM.

In accordance with yet another aspect of the invention, a die stack package is provided and includes a substrate, a stack of computing components, a thermal plate disposed within the stack of computing components, a thermal interface material (TIM) disposed on respective surfaces of the stack and the thermal plate and a lid adhered to the substrate to surround the thermal plate and the stack, the lid including a lid surface, which thermally communicates with the stack surface TIM, and a fin, which thermally communicates with thermal plate surface TIM.

BRIEF DESCRIPTION OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

In accordance with aspects of the invention, an architecture independent cooling solution for die stacks is provided by the addition of a thermal plate to the bottom of the die stack or into a middle of the die stack. Further enhancement in an interconnection between the chips of the die stack and the thermal plate is achieved through thermally conductive adhesive. A lid or heat spreader includes a fin that contacts the thermal plate to provide an additional cooling path for the die stack. The fin may be slanted or coupled to a large area of the lid, such as those areas that would normally be relatively cool regions of the lid. As such, an amount or degree of the die stack cooling is only limited by an overall package size. In addition, de-coupling capacitors and other passive components can be integrated with the thermal plate and cooled as well. Thermal Interface Material (TIM), which is relatively mechanically strong, may be disposed between, for example, the thermal plate and the fin to increase mechanical stability of the die stack especially where the substrate is formed of organic material.

Figure 1:
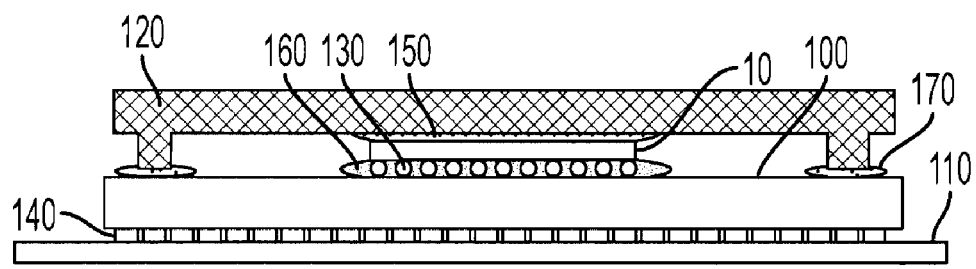
FIG. 1 is a cross-sectional view of a typical flip-chip electronic package with a single die.
Figure 2:
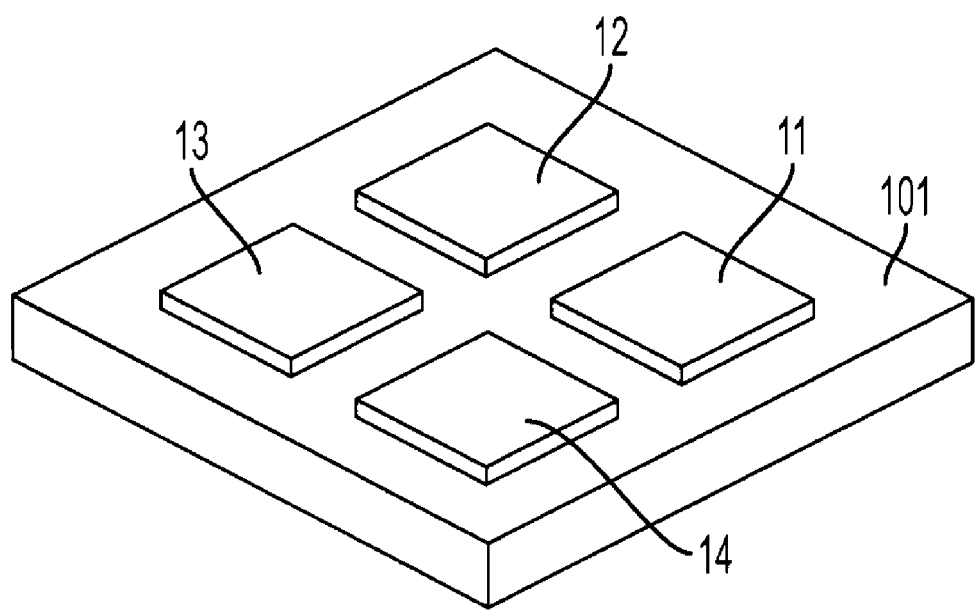
FIG. 2 is a perspective view of multiple dies arranged horizontally on a chip carrier.
Figure 3:
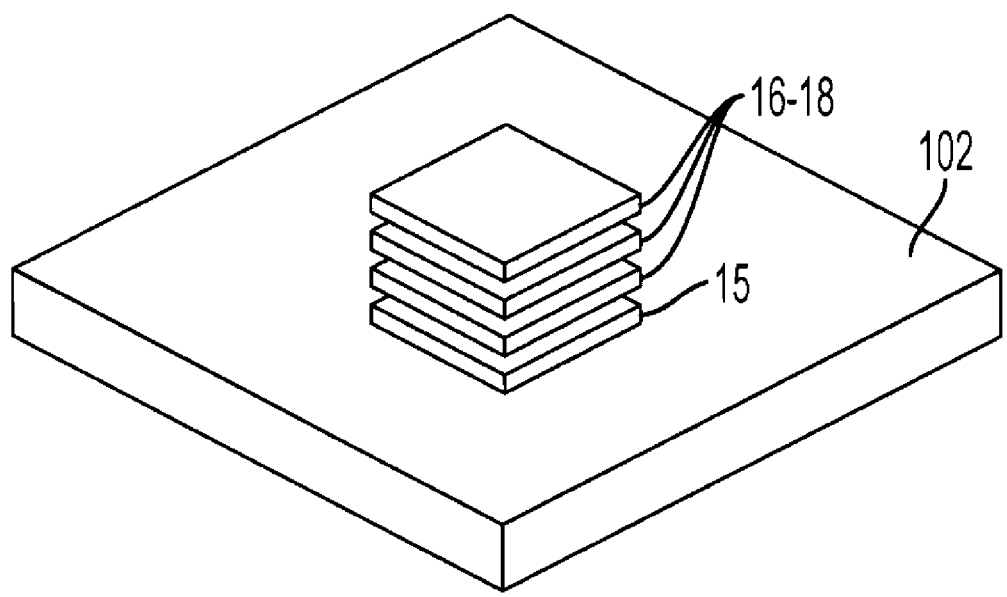
FIG. 3 is a perspective view of multiple dies arranged vertically in a die stack.
Figure 4:
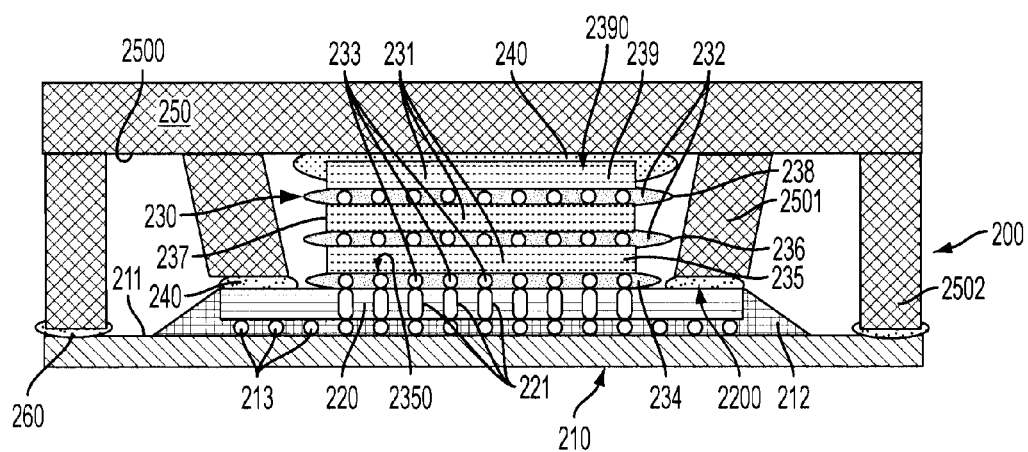
FIG. 4 shows a cross-sectional view of an electronic package with a vertical die stack according to an embodiment of the invention.

With reference to FIG. 4, a die stack package 200 is provided. The die stack package 200 includes a substrate 210, a thermal plate 220, a die stack 230, including a stack of computing components 231, such as silicon chips, Thermal Interface Material (TIM) 240 and a lid 250. The thermal plate 220 has a Coefficient of Thermal Expansion (CTE) that is substantially matched to that of at least the computing components 231 and possibly the substrate 210 and the lid 250 as well.

The substrate 210 may be formed of ceramic and/or organic materials and may be formed as a printed circuit board (PCB) or a component that couples the die stack package 200 to a PCB for use in a computing device. The substrate 210 has a generally planar surface 211 on which underfill 212 is disposed. The underfill 212 is electrically insulating, provides for a mechanical connection between the thermal plate 220 and the substrate 210 and provides a heat bridge between the thermal plate 220 and the substrate 210. Electrical connections 213, such as solder joints and/or controlled collapse chip connection (C4) bumps, may be embedded within the underfill 212 with underfill 212 further providing structural support for the solder joints during any thermal expansion that may occur.

The thermal plate 220 is disposed on the underfill 212. The thermal plate 220 may be a substantially flat member with planar surfaces and may be formed to define a through-silicon-via (TSV) 221 by which a signal is transmittable across the thermal plate 220 and between the die stack 230 and the electrical connections 213.

The thermal plate 220 includes at least one of silicon, diamond, metallic material and/or metallic alloy. The material of the thermal plate 220 may be chosen in accordance with a material of the substrate 210 so as to provide for CTE matching and/or mechanical strength where necessary. For example, where the substrate 210 is formed of an organic material, the thermal plate may be formed of a high strength material that is CTE matched to the organic material such that thermal expansion of the die stack package 200 is permitted but warping and/or non-coplanarity is reduced due to the additional coupling through the thermal plate 220. Alternatively, for the organic substrate 210, the CTE of the thermal plate 220 can match that of the organic substrate 210 or that of the die stack 230. Here, either choice has benefits in that matching to the die stack 230 CTE improves the die stack 230 and its interconnect reliability while matching to the substrate 210 enhances the overall package coplanarity. When the substrate 210 is formed of a ceramic material, the thermal plate 220 may be formed of a relatively low CTE material that matches both the CTE of the substrate 210 and the CTE of the die stack 230.

The die stack 230 is formed as a stack of alternating layers of adhesive 232 and the computing components 231. The adhesive 232 may include thermally conductive adhesive and, like the underfill 212, may support additional electrical connections 233 embedded therein. For example, the adhesive 232 may be an elastomer, a resin filled with electrically non-conductive particular matter, such as beryllium oxide, or some combination of these or similar materials.

The computing components 231 are substantially similarly shaped and sized and, as such, each computing component 231 may be operatively interchangeable with one another. That is, each computing component 231 may be employed as a central processing unit (CPU), a memory/storage device or some combination thereof. With this said, it is also possible that each of the computing components 231 may be of a different or unique shape and size with some being single units and others being segmented. In this case, additional thermal paths may be formed between the die stack 230 and the lid 250 besides those which are described herein.

As a whole, the die stack 230 is disposed on the thermal plate 220 or with the thermal plate 220 inserted therein and in electrical communication with the electrical connections 213. As such, during computing operations of the computing components 231, signals may be transmitted from each of the computing components 231 to the electrical connections 213 and vice versa by way of, for example, the TSV 221 of the thermal plate 220 and the additional electrical connections 233.

As shown in FIG. 4, the die stack 230 is formed of a bottom-most layer 234 of adhesive 232 with additional electrical connections 233 embedded therein, a second layer 235 including a bottom-most computing component 231, a third layer 236 of adhesive 232 and additional electrical connections 233, a fourth layer 237 of an intermediate computing component 231, a fifth layer 238 of adhesive 232 and additional electrical connections 233 and a sixth layer 239 of a top-most computing component 231. With this configuration, the adhesive 232 and the additional electrical connections 233 of the bottom-most layer 234 are interposed between a top surface 2200 of the thermal plate 220 and a bottom surface 2350 of the bottom-most computing component 231 of the second layer 235. Also, signals are transmittable between the computing components 231 of each layer by way of the additional electrical connections 233. A top surface 2390 of the top-most computing component 231 of the sixth layer 239 is exposed vertically for thermal path formation.

Figure 7:
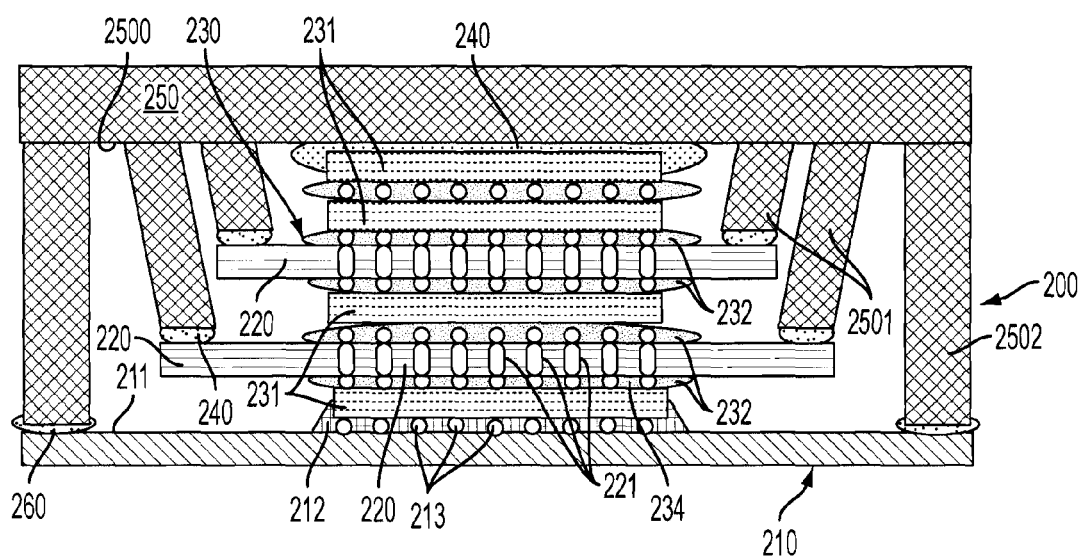
FIG. 7 shows a cross-sectional view of an electronic package with a vertical die stack according to still further embodiments of the invention.

It is understood that the configuration of FIG. 4 and the other figures is merely exemplary and that other similar configurations are possible. For example, there may be additional layers of computing components 231 and adhesive 232 along with possibly additional thermal plates 220 disposed at various locations within the die stack package 200 or the die stack 230, in particular, as shown in FIG. 7. Also computing components 231 may, in some embodiments as described above, have different shapes or sizes or may be segmented and displaced from one another within a given layer. The computing components 231 may have similar or differing vertical thicknesses and may be stacked in a substantially vertical direction or offset from one another. Still further, different types of adhesives 232 may be used in a single die stack 230 in accordance with particular application requirements. For example, a die stack 230 may require that the adhesives 232 exhibit a gradient of strengths and/or expansion capabilities as one goes up the die stack 230. As a further example, the adhesives 232 may need to be varied to account for different semiconductor technologies (silicon germanium (SiGe) devices, silicon-on-saphire devices, silicon (Si) devices, etc.).

The TIM 240 is disposed on respective surfaces of the die stack 230 and the thermal plate 220. In particular, as shown in FIG. 4, the TIM 240 is disposed on the top surface of the thermal plate 220 and the top surface 2390 of the top-most computing component 231 of the sixth layer 239. The TIM 240 may include any thermally conductive material but, in some embodiments and especially where the substrate 210 is formed of organic material, the TIM 240 may include relatively mechanically strong materials so as to provide overall support for the die stack package 200.

The lid 250 or heat spreader is adhered to the substrate 210 via seal adhesive 260 to surround the thermal plate 220 and the die stack 230. To this end, the lid 250 includes a lid surface 2500, which thermally communicates with the TIM 240 disposed on the respective surfaces of the die stack 230, a fin 2501, which thermally communicates with the TIM 240 disposed on the respective surfaces of the thermal plate 220, and sidewalls 2502, which support the lid surface 2500 on the substrate 210.

Figure 5:
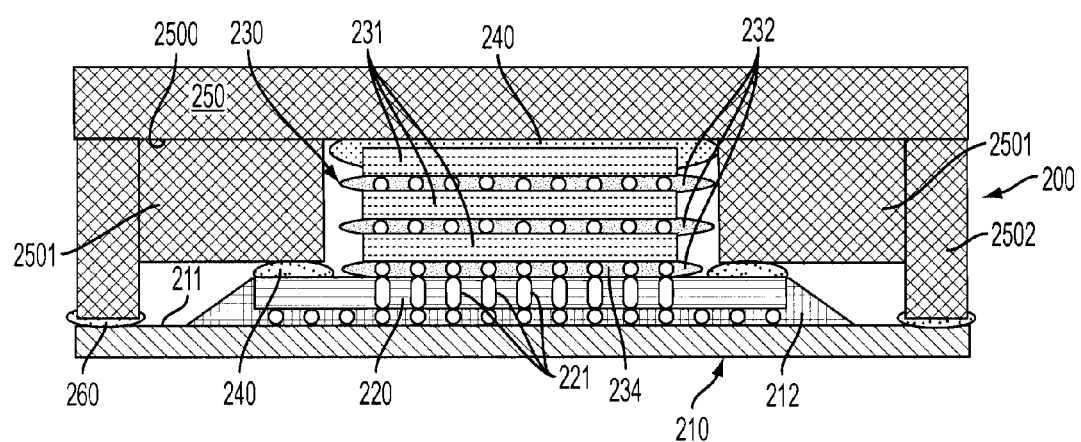
FIG. 5 shows a cross-sectional view of an electronic package with a vertical die stack according to a further embodiment of the invention.
Figure 6:
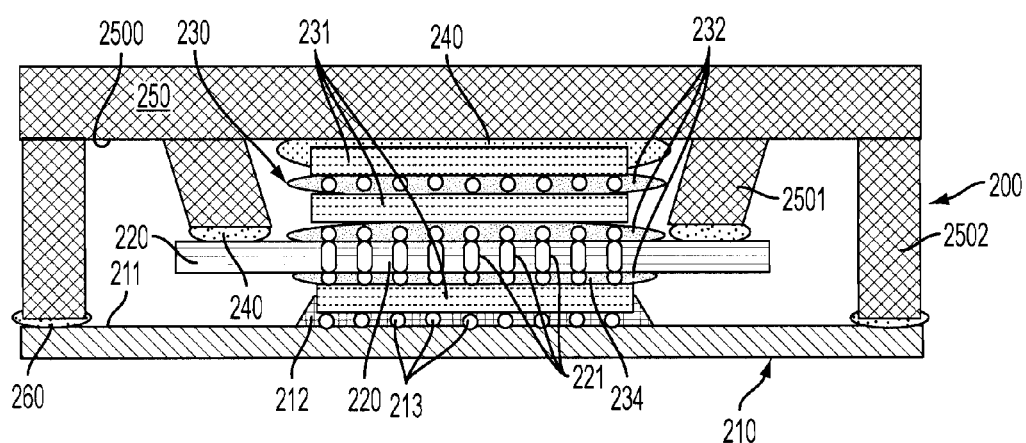
FIG. 6 shows a cross-sectional view of an electronic package with a vertical die stack according to still further embodiments of the invention.

With reference to FIGS. 4, 5, 6 and 7 and, in accordance with further embodiments of the invention, the fin 2501 may be formed in varied shapes and sizes and the thermal plate 220 may be positioned in varied locations within the lid 250. For example, as shown in FIGS. 4, 6 and 7, the fin 2501 may be slanted from a normal direction relative to the thermal plate 220. As a further example, as shown in FIG. 5, the fin 2501 may contact the lid surface 2500 and the sidewalls 2502. In that way, the fin 2501 may occupy a relatively large portion of the space within the lid 250 and, in fact, may have a size that is limited only to a desired overall size, weight and manufacturing cost of the package 200. As yet a further example, as shown in FIG. 6, the thermal plate may be positioned within the die stack 230 between layers of adhesive 232 and computing components 231 with the fin 2501 being angled.

In addition, the fin 2501 may be extended around a periphery of the thermal plate 220 such that a relatively large surface area of the thermal plate 220 is in contact with the fin 2501. Alternatively, the fin 2501 may be baffle shaped and may lie only on a side of the thermal plate 220. In this case, multiple fins 2501 may be employed to lie on sides of the thermal plate 220 separately from one another.

In accordance with another aspect of the invention, a method of assembling a die stack package 200 is provided. The method includes forming a die stack 230 of computing components 231 and layers of adhesive 232, positioning at least one thermal plate 220 in thermal communication with the die stack 230 and surrounding the die stack 230 and the at least one thermal plate 220 with a lid 250 supported on a substrate 210. In this way, the surrounding thereby defines first and second heat transfer paths. The first heat transfer path extends from one of the computing components 231 to the lid 250 via the at least one thermal plate 220 and a fin 2501, which is coupled to a surface 2500 of the lid 250 and the at least one thermal plate 220. The second heat transfer path extends from the one of the computing components 231 to the lid surface 2500 without passing through the at least one thermal plate 220.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A die stack package, comprising:
    a substrate;
    a stack of computing components;
    a plurality of thermal plates, each of which is thermally communicative with the stack; and
    a lid supported on the substrate to surround the stack and the at least one thermal plate to thereby define:
        a plurality of separate first heat transfer paths, each of which extends from one of the computing components to the lid via a corresponding one of the plurality of thermal plates and a corresponding one of a plurality of separate fins, each one of the plurality of separate fins being respectively coupled to a surface of the lid and a corresponding one of the plurality of thermal plates, and
        a second heat transfer path extending from the one of the computing components to the lid surface without passing through any thermal plate of the plurality of thermal plates.

2. The die stack package according to claim 1, wherein the computing components have similar sizes and shapes.

3. The die stack package according to claim 1, wherein at least the computing components and each of the plurality of thermal plates are Coefficient of Thermal Expansion (CTE) matched.

4. The die stack package according to claim 1, wherein each one of the plurality of fins is slanted from a normal direction relative to the corresponding one of the plurality of thermal plates.

5. The die stack package according to claim 1, wherein each one of the plurality of fins contacts the lid surface and a lid sidewall supporting the lid surface on the substrate.

6. The die stack package according to claim 1, wherein at least one thermal plate of the plurality of thermal plates is interposed between the die stack and the substrate.

7. The die stack package according to claim 1, wherein at least one thermal plate of the plurality of thermal plates is interposed between computing components in the stack.

8. A method of assembling a die stack package, comprising:
    forming a stack of computing components;
    positioning a plurality of thermal plates in thermal communication with the stack; and
    surrounding the stack and the at least one thermal plate with a lid supported on a substrate to thereby define:

a plurality of separate first heat transfer paths, each of which extends from one of the computing components to the lid via a corresponding one of the plurality of thermal plates and a corresponding one of a plurality of separate fins, each one of the plurality of separate fins being respectively coupled to a surface of the lid and a corresponding one of the plurality of thermal plates, and a second heat transfer path extending from the one of the computing components to the lid surface without passing through any thermal plate of the plurality of thermal plates.

9. A die stack package, comprising:
a substrate on which underfill is disposed with electrical connections embedded therein;
a thermal plate disposed on the underfill;
a stack of alternating layers of adhesive and computing components disposed on the thermal plate and in electrical communication with the electrical connections;
an additional thermal plate disposed within the stack;
a thermal interface material (TIM) disposed on respective surfaces of the stack, the thermal plate and the additional thermal plate; and
a lid adhered to the substrate to surround the thermal plate, the stack and the additional thermal plate, the lid including:
a lid surface, which thermally communicates with the stack surface TIM to define a heat transfer path, and
a plurality of separate fins, one of which thermally communicates with the lid surface and thermal plate surface TIM and another one of which thermally communicates with the lid surface and additional thermal plate surface TIM to define other, separate heat transfer paths extending from the lid surface to the corresponding TIM.

10. The die stack package according to claim 9, wherein the substrate comprises at least one of organic and ceramic material.

11. The die stack package according to claim 9, wherein at least the computing components, the thermal plate and the additional thermal plate are Coefficient of Thermal Expansion (CTE) matched.

12. The die stack package according to claim 9, wherein the thermal plate and the additional thermal plate each comprises at least one of silicon, diamond, metallic material and metallic alloy and is formed to define a through-silicon-via (TSV) by which a signal is transmittable between the stack and the electrical connections.

13. The die stack package according to claim 9, wherein the computing components have similar shapes and sizes.

14. The die stack package according to claim 9, wherein:
a bottom surface of a bottom-most computing component in the stack faces a top surface of the thermal plate,
the thermal plate surface TIM is disposed on the top surface of the thermal plate, and
the stack surface TIM is disposed on a top surface of a top-most computing component in the stack.

15. The die stack package according to claim 9, wherein each one of the plurality of fins is slanted from a normal direction relative to the corresponding one of the thermal plate and the additional thermal plate.

16. The die stack package according to claim 9, wherein each one of the plurality of fins contacts the lid surface and a lid sidewall supporting the lid surface on the substrate.

17. A die stack package, comprising:
a substrate;
a stack of computing components;
a plurality of thermal plates disposed within the stack of computing components;
a thermal interface material (TIM) disposed on respective surfaces of the stack and each thermal plate of the plurality of thermal plates; and
a lid adhered to the substrate to surround the plurality of thermal plates and the stack, the lid including:
a lid surface, which thermally communicates with the stack surface TIM to define a heat transfer path, and
a plurality of separate fins, each one of which thermally communicates with the lid surface and thermal plate surface TIM of a corresponding one of the plurality of thermal plates to define other, separate heat transfer paths extending from the lid surface to the corresponding TIM.

18. The die stack package according to claim 17, wherein the substrate comprises at least one of organic and ceramic material.

19. The die stack package according to claim 17, wherein at least the computing components and each of the plurality of thermal plates are Coefficient of Thermal Expansion (CTE) matched.

20. The die stack package according to claim 17, wherein each of the plurality of thermal plates comprises at least one of silicon, diamond, metallic material and metallic alloy and is formed to define a through-silicon-via (TSV).

21. The die stack package according to claim 17, wherein the computing components have similar shapes and sizes.

22. The die stack package according to claim 17, wherein the thermal plate surface TIM is disposed on the respective top surface of each of the plurality of thermal plates and the stack surface TIM is disposed on a top surface of a top-most computing component in the stack.

23. The die stack package according to claim 17, wherein each one of the plurality of separate fins is slanted from a normal direction relative to the corresponding one thermal plate of the plurality of thermal plates.

* * * * *